United States Patent
Li

(10) Patent No.: US 10,707,288 B2
(45) Date of Patent: Jul. 7, 2020

(54) TFT ARRAY SUBSTRATE AND OLED DISPLAY PANEL

(71) Applicant: Wuhan China Star Optoelectronics Semiconductor Display Technology Co., Ltd., Wuhan, Hubei (CN)

(72) Inventor: Xue Li, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/993,963

(22) Filed: May 31, 2018

(65) Prior Publication Data
US 2019/0280074 A1    Sep. 12, 2019

Related U.S. Application Data

(63) Continuation of application No. PCT/CN2018/083312, filed on Apr. 17, 2018.

(30) Foreign Application Priority Data

Mar. 12, 2018 (CN) ............... 2018 1 0199773

(51) Int. Cl.
H01L 27/32       (2006.01)
H01L 51/52       (2006.01)
H01L 27/12       (2006.01)

(52) U.S. Cl.
CPC ........ H01L 27/3276 (2013.01); H01L 27/124 (2013.01); H01L 27/3262 (2013.01); H01L 51/5221 (2013.01)

(58) Field of Classification Search
CPC combination set(s) only.
See application file for complete search history.

(56) References Cited

U.S. PATENT DOCUMENTS

| 2016/0247436 | A1* | 8/2016 | Lee | ............... | G09G 3/2003 |
| 2016/0379906 | A1* | 12/2016 | Kim | ............... | G09G 3/3688 |
|  |  |  |  |  | 257/48 |
| 2018/0284153 | A1* | 10/2018 | Chan | ............... | G01R 31/2621 |

FOREIGN PATENT DOCUMENTS

| CN | 103048837 A | 4/2013 |
| CN | 102566188 A | 7/2013 |

(Continued)

OTHER PUBLICATIONS

First Office Action from China Patent Office in a counterpart Chinese patent Application 201810199773.5, dated Nov. 29, 2019 (10 pages).

*Primary Examiner* — Matthew L Reames
(74) *Attorney, Agent, or Firm* — Brinks Gilson & Lione

(57) ABSTRACT

The present disclosure provides a TFT array substrate and an OLED display panel. The TFT array substrate includes a display area, a non-display area around the display area, a COF bonding area and a test area. The COF bonding area and the test area are arranged in the non-display area. The test area includes several test pads spaced apart. According to the present disclosure, the test pads are arranged on the TFT array substrate. Thus, during testing, it is not necessary to cut off the connection wire between the test pads and the TFT array substrate. Therefore, the problem of uncovered metal residue after the cut-off of the connection wire may be avoided. Moreover, when the test of the TFT array substrate is finished, the test pads will be covered by insulating material such that the problem of uncovered metal residue of the test pads can be avoided.

9 Claims, 6 Drawing Sheets

(56) References Cited

FOREIGN PATENT DOCUMENTS

| | | | |
|---|---|---|---|
| CN | 104732902 | A | 6/2015 |
| CN | 105913787 | A | 8/2016 |
| CN | 107065336 | A | 8/2017 |
| CN | 107085333 | A | 8/2017 |
| CN | 107180594 | A | 9/2017 |
| CN | 107300793 | A | 10/2017 |
| CN | 107329336 | A | 11/2017 |
| CN | 107331294 | A | 11/2017 |
| KR | 10-2004-0061424 | A | 7/2004 |
| KR | 10-2014-0095900 | A | 8/2014 |

* cited by examiner

TFT ARRAY SUBSTRATE AND OLED DISPLAY PANEL

CROSS-REFERENCE TO RELATED APPLICATIONS

The present application is a continuation-application of International (PCT) Patent Application No. PCT/CN2018/083312, field on Apr. 17, 2018, which claims foreign priority of Chinese Patent Application No. 201810199773.5, field on Mar. 12, 2018 in the State Intellectual Property Office of China, the entire contents of which are hereby incorporated by reference.

TECHNICAL FIELD

The present disclosure generally relates to the OLED display field, and in particular to a TFT array substrate and an OLED display panel.

BACKGROUND

With the rapid development of technology, the requirements to the display components has become higher and higher. As well known, an organic light-emitting dioxide (OLED) display components are widely used. The organic light-emitting dioxide is light, bendable and easy to carry with. It also has a narrow frame.

The manufacturing process of an OLED display component generally include four stages, the Array stage, the EL stage, the TFE stage and the Module stage. During the manufacturing, it is very important to test the TFT array substrate after the Array stage of the product, which can affect the product's yield and reliability.

According to the traditional flexible OLED structure, for a COF (chip on film) display panel, the test module 11 is usually arranged outside the TFT array substrate 12, as shown in FIG. 1. The test module 11 is connected to the array substrate 12 by the connection wire 13. When the test of the TFT array substrate 12 is finished, the connection wire 13 is cut off. In this way, the test pads of the test module 11 will not be exposed. However, metal residue of the connection wire 13 which is cut off is still uncovered and exposed. Thus, the problem of corrosion and ESD (electro-static discharge) may arise.

DETAILED DESCRIPTION

The disclosure will now be described in detail with reference to the accompanying drawings and examples. Apparently, the described embodiments are only a part of the embodiments of the present disclosure, not all of the embodiments. All other embodiments obtained by a person of ordinary skill in the art based on the embodiments of the present invention without creative efforts shall fall within the protection scope of the present invention.

Figure 1:
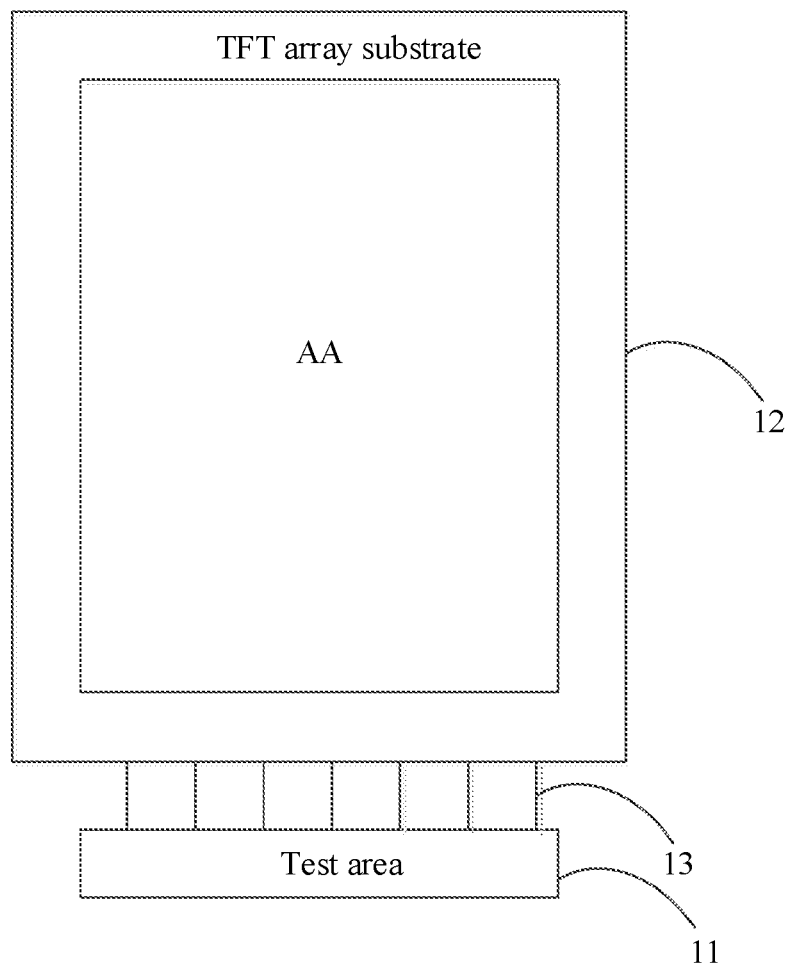
FIG. 1 is a schematic diagram of the TFT array substrate and the test module according to related art.
Figure 2:
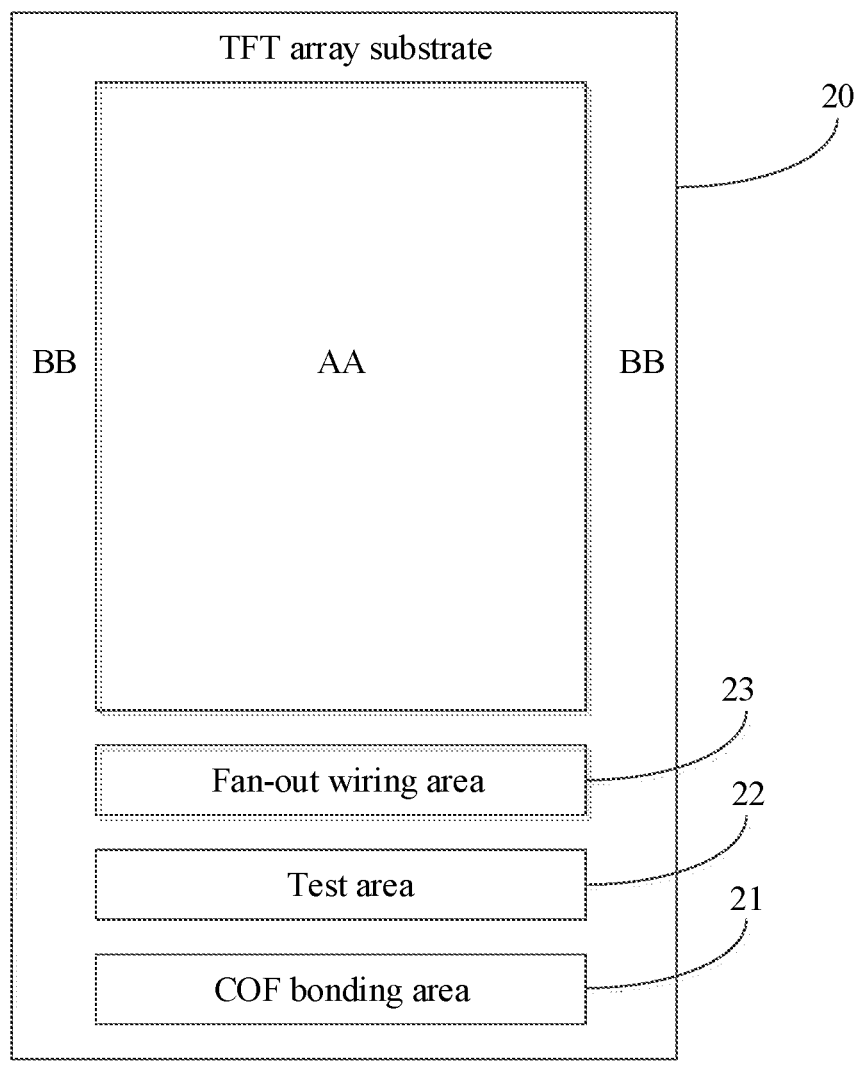
FIG. 2 is a schematic diagram of a TFT array substrate according to one embodiment of the present disclosure.

Referring to FIG. 2, FIG. 2 is a schematic diagram of the TFT array substrate according to an embodiment of the present disclosure. As shown in FIG. 2, the TFT array substrate 20 may include a COF bonding area 21, a test area 22, a fan-out wiring area 23, a display area AA and a non-display area BB around the display area AA.

The test area 22 may be arranged between the COF bonding area 21 and the fan-out wiring area 23. Specifically, the COF bonding area 21, the test area 22 and the fan-out wiring area 23 may be arranged in the non-display area BB. The COF bonding area 21, the test area 22 and the fan-out wiring area may be arranged at a same side of the display area AA. The fan-out wiring area 23 may be arranged close to the display area AA while the COF bonding area 21 may be arranged far away from the display area AA.

In this embodiment, the COF bonding area 21, the test area 22 and the fan-out wiring area 23 may be disposed at the bottom of the TFT array substrate 20.

Figure 3:
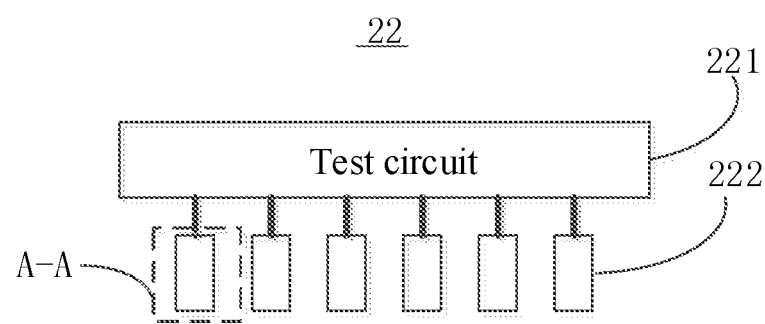
FIG. 3 is a schematic diagram of the test area of the TFT array substrate of claim 2.

Referring also to FIG. 3, the test area 22 may include a test circuit 221 and a number of test pads 222. The test pads 222 may be electrically connected to the test circuit. The test pads 222 may be aligned in on the test area 22 and evenly arranged.

Figure 4:
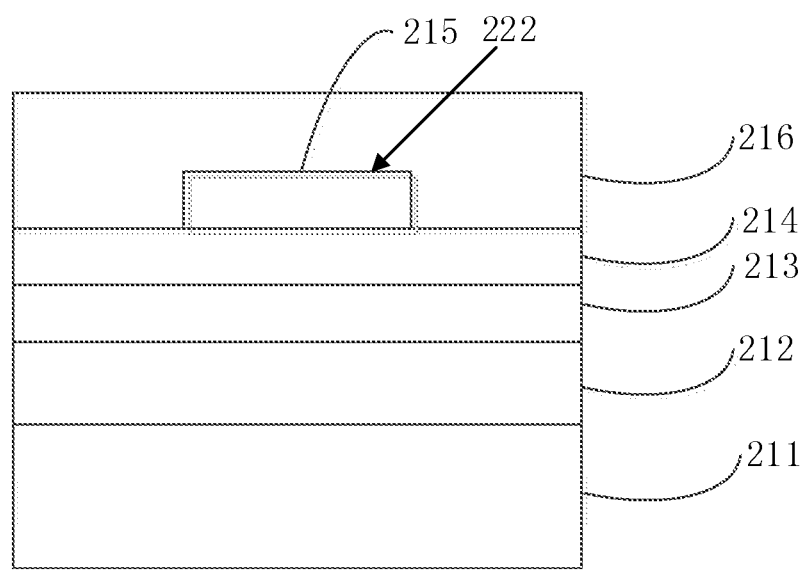
FIG. 4 is a section view of the test area of FIG. 3 along line A-A.

Referring also to FIG. 4, FIG. 4 is a section view of the test area of FIG. 3 along line A-A. As shown in FIG. 4, the test area 22 may include a barrier layer 212, a first inorganic insulating layer 213, a second organic insulating layer 214 and a first metal layer 215 successively disposed on the substrate 211. The first metal layer 215 may include a number of test pads 222 spaced apart. Furthermore, after the test of the TFT array substrate 20 is finished, an organic insulating layer 216 may be arranged in the test area 22. The organic insulating layer 216 may cover the test pads 222.

In this embodiment, the test pads 222 are utilized to receive or transmit signals so as to test the TFT array substrate 20 during the Array stage, and to verify whether the pixels of the TFT array substrate 20 function abnormally. If there is a problem, the TFT array substrate 20 can be repaired and re-tested. Based on the test result, the operator can decide whether to enter the next manufacturing stage or not. By applying this test method during the Array stage, the product yield may be increased, and material waste may be reduced such that the product cost may be reduced.

Furthermore, after the Array stage, the top of the test pads 222 will be covered by insulating material, i.e., the organic insulating layer 216, thus phenomena of corrosion on uncovered metal residue can be avoided. According to this embodiment, the test of the TFT array substrate 20 should be carried out after the manufacturing process of the TFT components (also the test pads) during the Array stage, and the other layers such as the organic insulating layer 216 should be manufactured after the test is finished.

In this embodiment, the test area 22 is arranged between the COF bonding area 21 and the fan-out wiring area 23. Thus, the space of the TFT array substrate 20 can be fully utilized. In comparison to prior art, according to the present disclosure, the test module is not arranged outside the TFT array substrate so that it is not necessary to cut it off. Thus, the utilization of the glass substrate may be improved.

Figure 5:
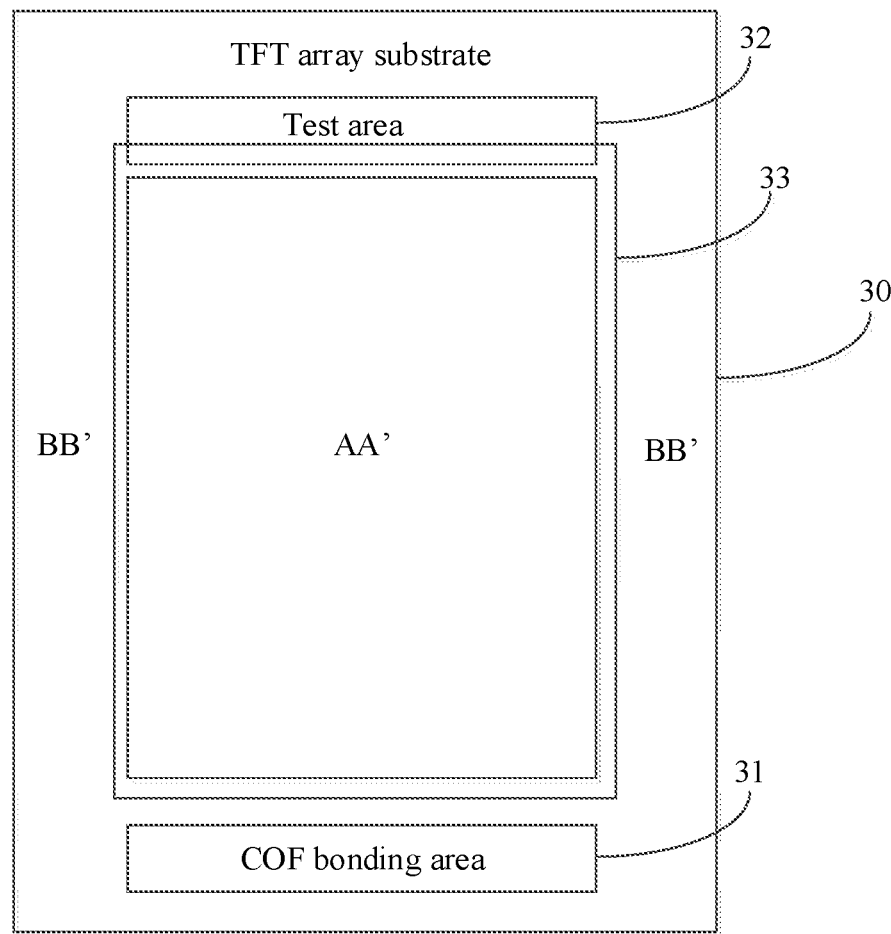
FIG. 5 is a schematic diagram of the TFT array substrate according to another embodiment of the present disclosure.

FIG. 5 is a schematic diagram of a TFT array substrate according to another embodiment of the present disclosure. As shown in FIG. 5, the TFT array substrate 30 may include a COF bonding area 31, a test area 32, a display area AA', a non-display area BB' and a negative electrode layer 33.

The COF bonding area 31 and the test area 32 may be arranged in the non-display area BB'. The COF bonding area 31 and the test area 32 may be arranged at two opposite sides of the display area AA'. Optionally, the COF bonding area 31 may be arranged at the bottom of the TFT array substrate 30. The test area 32 may be arranged at the top of the TFT array substrate 30.

The negative electrode layer 33 may cover the display area AA'. The negative electrode layer 33 may have a portion overlapping the test area 32.

Figure 6:
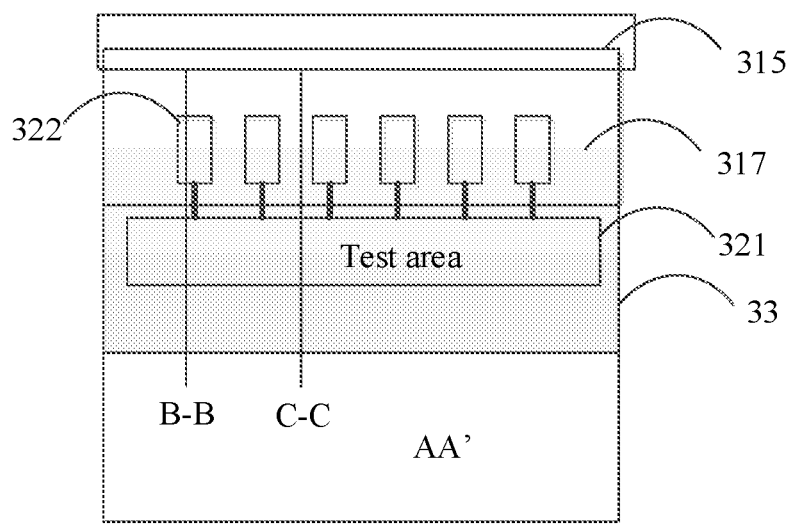
FIG. 6 is a schematic diagram of the test area of the TFT array substrate of FIG. 5.
Figure 7:
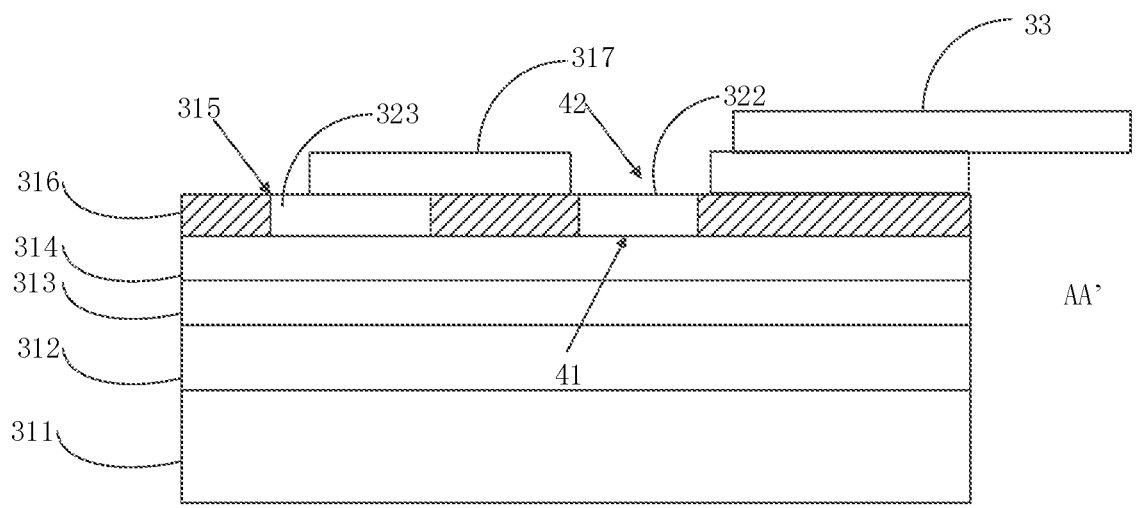
FIG. 7 is a section view of the test area of FIG. 6 along line B-B.
Figure 8:
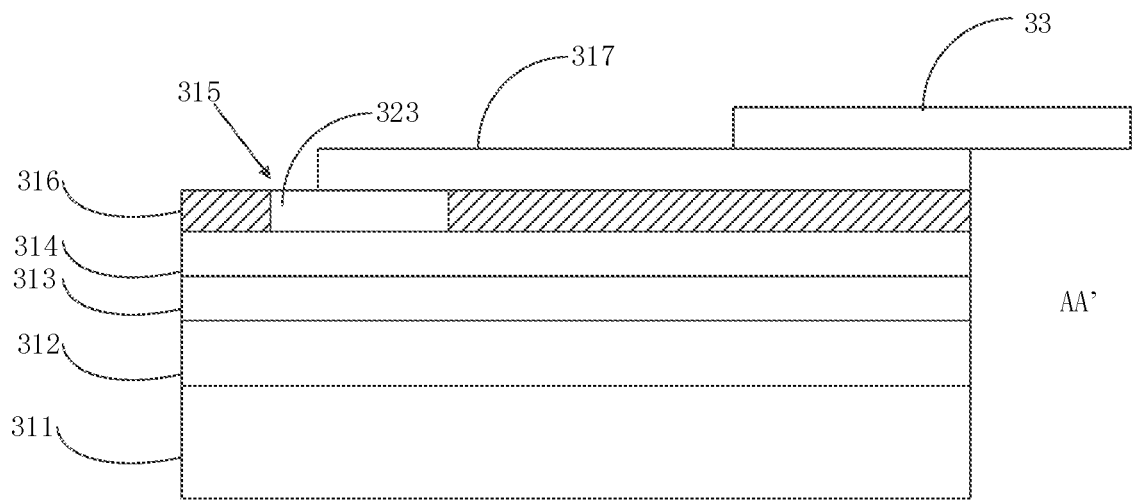
FIG. 8 is a section view of the test area of FIG. 6 along line C-C.

Referring to FIGS. 6, 7 and 8, as shown in the figures, the test area 32 may include a test circuit 321 and a number of test pads 322. The test pads 322 may be electrically connected to the test circuit 321. The test pads 322 may be aligned in the test area and evenly arranged.

The test area 32 may include a barrier layer 312, a first inorganic insulating layer 313, a second inorganic insulating layer 314, a first metal layer 315, an organic insulating layer 316 and a second metal layer 317 successively disposed on the substrate 311.

The first metal layer 315 may include a number of test pads 322 disposed in the test area 32 and a signal line 323 spaced apart from the test pads 322.

The organic insulating layer 316 may define a first opening 41. The second metal layer 317 may define a second opening 42 corresponding to the first opening 41. Thus the test pads 322 may be exposed by the second opening 42 and the first opening 41.

The signal line 323 may be connected to the negative electrode layer 33 through the second metal layer 317. The negative electrode layer 33 may cover the display area AA'. The edge of the negative electrode layer 33 may be in touch with the second metal layer 317. The signal line 323 may be a power line which is able to provide the voltage VSS to the negative electrode layer 33.

It can be seen from FIG. 7 and FIG. 8, except the test pads 322, the other portion of the first metal layer 315, i.e., the signal line 323 may transmit the voltage VSS as power signal to the negative electrode layer 33 through the second metal layer 317 so as to make the TFT array substrate 30 work.

According to traditional TFT array substrate design, the voltage VSS is provided by the signal line 323 of the first metal layer 315. The signal line 323 is connected to the negative electrode layer 33 through a transition metal layer (i.e., the second metal layer 317) so as to provide the voltage VSS as power supply for the negative electrode layer 33. In this embodiment, the test pads 322 is located in the first metal layer 315. In order to avoid short circuit of the first metal layer 315 and the signal line 323, the test pads 322 should be arranged between the signal line 323 and the negative electrode layer 33 and the organic insulating layer 316 and the second metal layer 317 should form the through hole to expose the test pads 322. In this way, after the manufacturing process of the TFT or the whole Array stage is completed, the test pads can always be utilized to test the TFT array substrate 30. Also, during the TFE stage, the test pads 322 can be covered by insulating material and encapsulated inside. Thus no uncover metal residue will exist.

Figure 9:
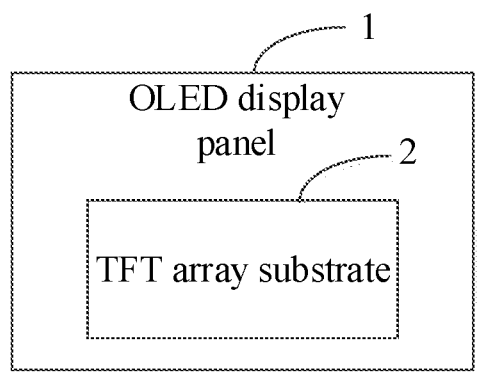
FIG. 9 is a schematic diagram of the OLED display panel according to an embodiment of the present disclosure.

FIG. 9 is a schematic diagram of the OLED display panel according to an embodiment of the present disclosure. As shown in FIG. 9, the OLED display panel 1 may include a TFT array substrate 2. The TFT array substrate 2 may be the above-mentioned TFT array substrate 20 or 30.

The present disclosure provides a TFT array substrate and an OLED display panel each of which includes a display area, a non-display area around the display area, a COF bonding area and a test area. The COF bonding area and the test area are arranged spaced apart in the non-display area. The test area includes a number of test pads spaced apart. In this way, the test pads of the present disclosure may be arranged on the TFT array substrate. Thus it is no longer necessary to cut off the connection wire between the test pads and the TFT array substrate. Furthermore, after the test of the TFT array substrate is finished, the test pads can be covered by insulating material so as to avoid the problem due to uncovered metal residue of the test pads.

The present disclosure provides a TFT array substrate. The TFT array substrate defines a display area and a non-display area. One portion of the TFT array substrate corresponding to the non-display area may include a substrate, a barrier layer, a first inorganic insulating layer, a second inorganic insulating layer and a first metal layer. The barrier layer, the first inorganic insulating layer, the second inorganic insulating layer and the first metal layer may be successively disposed on the substrate. The first metal layer may include a number of test pads.

Another portion of the TFT array substrate corresponding to the display area may include a test circuit and TFT components. The test circuit may be coupled with the TFT components. The test pads may be connected to the test circuit to form a test module.

In some embodiments, the one portion of the TFT array substrate corresponding to the non-display area may further include an organic insulating layer disposed on the second insulating layer and surrounding the first metal layer.

In some embodiments, the organic insulating layer may define a number of first openings so as to expose the test pads.

In some embodiments, the another portion of the TFT array substrate corresponding to the display area may further include a negative electrode layer. The one portion of the TFT array substrate corresponding to the non-display area may further include a second metal layer disposed on the organic insulating layer. The second metal layer may define a number of second openings communicated with the first openings so as to expose the plurality of test pads. The first metal layer may further include a signal line spaced apart from the test pads. The second metal layer may be in touch with the signal line and the negative electrode layer such that the signal line is electrically connected to the negative electrode layer.

In some embodiments, the signal line may be a power line providing a voltage VSS for the negative electrode layer.

In some embodiments, the test pads are aligned and evenly arranged.

In some embodiments, the TFT array substrate may further include a COF bonding pad. The COF bonding pad and the test pads may be arranged in the non-display area and spaced apart from each other.

In some embodiments, the TFT array substrate may further include a fan-out pad. The fan-out pad and the COF bonding pad may be arranged at a same side relative to the display area, and the test pads may be arranged between the COF bonding pad and the fan-out pad.

In some embodiment, the COF bonding pad and the test pads may be arranged at two opposite sides relative to the display area.

The foregoing is merely embodiments of the present disclosure, and is not intended to limit the scope of the disclosure. Any transformation of equivalent structure or equivalent process which uses the specification and the accompanying drawings of the present disclosure, or directly or indirectly application in other related technical fields, are likewise included within the scope of the protection of the present disclosure.

What is claimed is:

1. A TFT array substrate, defining a display area and a non-display area, wherein
    one portion of the TFT array substrate corresponding to the non-display area comprises a substrate, a barrier layer, a first inorganic insulating layer being in direct contact with the barrier layer, a second inorganic insulating layer and a first metal layer, and the barrier layer, the first inorganic insulating layer, the second inorganic insulating layer and the first metal layer are successively disposed on the substrate, the first metal layer comprises a plurality of test pads;
    wherein, the plurality of test pads are connected to a test circuit located on the TFT array substrate to form a test module;
    wherein the one portion of the TFT array substrate corresponding to the non-display area further comprises an organic insulating layer disposed on the second insulating layer and surrounding the first metal layer;
    wherein the organic insulating layer defines a plurality of first openings so as to expose the plurality of test pads by the first opening;
    wherein another portion of the TFT array substrate corresponding to the display area further comprises a negative electrode layer;
    the one portion of the TFT array substrate corresponding to the non-display area further comprises a second metal layer disposed on the organic insulating layer, the second metal layer defines a plurality of second openings communicated with the first openings so as to expose the plurality of test pads;
    wherein the first metal layer further comprises a signal line spaced apart from the plurality of test pads, the second metal layer is in touch with the signal line and the negative electrode layer such that the signal line is electrically connected to the negative electrode layer.

2. The TFT array substrate of claim 1, wherein the signal line is a power line providing a voltage for the negative electrode layer.

3. The TFT array substrate of claim 1, wherein the plurality of test pads are aligned and evenly arranged.

4. The TFT array substrate of claim 1, further comprising a COF bonding pad, the COF bonding pad and the plurality of test pads are arranged in the non-display area and spaced apart from each other.

5. The TFT array substrate of claim 4, wherein the COF bonding pad and the plurality of test pads are arranged at two opposite sides relative to the display area.

6. An OLED display panel, comprising a TFT array substrate, the TFT array substrate comprising a display area, a non-display area around the display area, a COF bonding area and a test area; wherein
    the COF bonding area and the test area are arranged in the non-display area; and
    the test area comprises a plurality of test pads spaced apart from each other, and the test area comprises a barrier layer and a first inorganic insulating layer being in direct contact with the barrier layer;
    wherein the COF bonding area and the test area are disposed at two opposite sides of the display area;
    wherein the test area further comprises a second inorganic insulating layer, a first metal layer and an organic insulating layer, and the barrier layer, the first inorganic insulating layer, the second inorganic insulating layer, the first metal layer and the organic insulating layer successively disposed on a substrate; wherein
    the first metal layer comprises the plurality of test pads located in the test area; and
    the organic insulating layer comprises a plurality of first openings so as to expose the plurality of test pads by the first openings;
    wherein the test area further comprises a second metal layer arranged on the organic insulating layer;
    the first metal layer further comprises a signal line spaced apart from the test pads;
    the signal line is connected to a negative electrode layer through the second metal layer;
    the second metal layer comprises a plurality of second openings corresponding to the first openings, and the test pads are exposed by the second openings and the first openings.

7. The OLED display panel of claim 6, wherein the signal line is a power line providing a voltage for the negative electrode layer.

8. The OLED display panel of claim 6, wherein the test pads are aligned and evenly arranged in the test area.

9. A TFT array substrate, defining a display area and a non-display area, wherein
    one portion of the TFT array substrate corresponding to the non-display area comprises a substrate, a barrier layer, a first inorganic insulating layer, a second inorganic insulating layer and a first metal layer, and the barrier layer, the first inorganic insulating layer, the second inorganic insulating layer and the first metal layer are successively disposed on the substrate, the first metal layer comprises a plurality of test pads;
    the plurality of test pads are connected to a test circuit located on the TFT array substrate to form a test module;
    the portion of the TFT array substrate corresponding to the non-display area further comprises an organic insulating layer disposed on the second insulating layer and surrounding the first metal layer;
    the organic insulating layer defines a plurality of first openings so as to expose the plurality of test pads by the plurality of first openings;
    the portion of the TFT array substrate corresponding to the display area further comprises a negative electrode layer;
    the portion of the TFT array substrate corresponding to the non-display area further comprises a second metal layer disposed on the organic insulating layer, the second metal layer defines a plurality of second openings communicated with the first openings so as to expose the plurality of test pads;
    wherein the first metal layer further comprises a signal line spaced apart from the plurality of test pads, the second metal layer is in touch with the signal line and the negative electrode layer such that the signal line is electrically connected to the negative electrode layer.

* * * * *